United States Patent [19]

Ogita

[11] 4,224,471
[45] Sep. 23, 1980

[54] FM RADIO RECEIVER

[75] Inventor: Minoru Ogita, Hamamatsu, Japan

[73] Assignee: Nippon Gakki Seizo Kabushiki Kaisha, Hamamatsu, Japan

[21] Appl. No.: 27,272

[22] Filed: Apr. 5, 1979

[30] Foreign Application Priority Data

Apr. 12, 1978 [JP] Japan .................................. 53/42792
May 31, 1978 [JP] Japan .................................. 53/66096

[51] Int. Cl.$^2$ ............................................. H04H 5/00
[52] U.S. Cl. ................................. 179/1 GD; 455/280
[58] Field of Search ............ 179/1 GD, 1 GE, 1 GC; 325/36, 488, 376, 387

[56] References Cited

U.S. PATENT DOCUMENTS

| | | | |
|---|---|---|---|
| 3,087,993 | 4/1963 | Van Hurck et al. ............. | 179/1 GE |
| 3,974,453 | 8/1976 | Ohsawa ........................... | 179/1 GE |
| 4,035,585 | 7/1977 | Ogita ............................... | 179/1 GE |
| 4,063,042 | 12/1977 | Mallon ............................. | 179/1 GD |

Primary Examiner—Douglas W. Olms

Attorney, Agent, or Firm—Frishauf, Holtz, Goodman & Woodward

[57] ABSTRACT

An FM radio receiver in which the output of an FM detector is direct-coupled with the input of a stereo multiplex demodulator. The stereo multiplex demodulator circuit includes an operational amplifier having first and second inputs, a switch circuit having first and second outputs at which separate left and right audio signal components appear, and negative feedback paths having feedback resistors and led from the first and second outputs of the switch circuit to the first input of the operational amplifier. The second input of the operational amplifier is kept at a given DC potential so that the first input of the operational amplifier is biased to the given DC potential. A reference potential point of the FM detector is supplied with the given DC potential so that a DC potential at the output of the FM detector is made equal to the given DC potential, permitting direct-coupling of the output of the FM detector to the input of the stereo multiplex demodulator.

10 Claims, 5 Drawing Figures

FM RADIO RECEIVER

BACKGROUND OF THE INVENTION

The invention relates to an FM radio receiver.

A conventional FM stereo receiver has a DC block-coupling capacitor between an FM detector and a stereo multiplex demodulator. The capacitor is provided to eliminate interference between a fixed DC voltage applied to the output terminal of the FM detector and a DC voltage which is applied to the input terminal of the demodulator independently of the DC voltage at the output terminal of the FM detector. The use of such a coupling capacitor, however, gives rise to some stereo demodulation problems. The capacitor reduces the amplitude of low frequency components contained in a stereo composite signal recovered by the FM detector and changes the phase of the components. This results in degradation of a separation between right and left audio signals of a low frequency range which are demodulated by the stereo multiplex demodulator. The degradation brings about the degradation of the separation in medium and high frequency ranges. The separation in the medium and high frequency ranges also changes depending on the presence or absence of the low frequency components. In other words, the separation in the medium and high frequency ranges is modulated by the low frequency components. As a result, the localization of a sound image will become ambigous and unstable.

Accordingly, an object of the invention is to provide an FM receiver with an improved separation characteristic during a stereophonic program reception.

SUMMARY OF THE INVENTION

Briefly, in an FM receiver according to the invention, an FM detector is directly coupled with a stereo multiplex demodulator, not by way of a coupling capacitor.

A stereo multiplex demodulator according to the invention is comprised of an operational amplifier having first and second inputs, a switch circuit connected to an output of the operational amplifier and having first and second outputs at which separate left and right audio signal components appear, and negative feedback paths having feedback resistors and led from the first and second outputs of the switch circuit to the first input of the operational amplifier. A given DC potential is applied to the second input of the operational amplifier so that a DC potential at the first input of the operational amplifier is made equal to the given DC potential. The given DC potential is applied to a reference potential point of the FM detector so that a DC potential at the output of the FM detector is made equal to the given DC potential. Since the output of the FM detector is made equal in DC potential of the first input of the operational amplifier, the output of the FM detector may be directly coupled to the input of the stereo multiplex demodulator.

Since the stereo multiplex demodulator is directly coupled with the FM detector, the stereo multiplex demodulator has an S curve response like the FM detector. Therefore, a control signal with a relatively high level for driving such an additional circuit as an automatic frequency control (AFC) circuit, a tuning indicator circuit or a muting circuit in the receiver may be formed of the output signals of the stereo multiplex demodulator.

DETAILED DESCRIPTION

Figure 1:
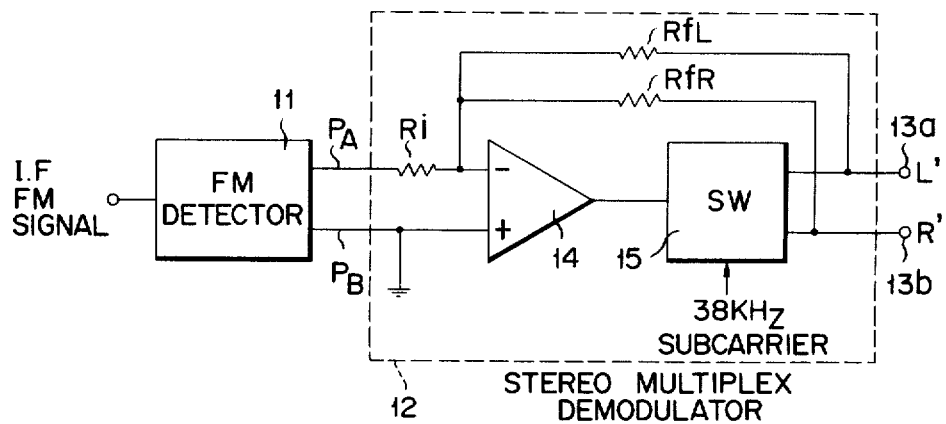
FIG. 1 shows an essential part of an FM receiver according to an embodiment of the invention.

Referring now to FIG. 1 illustrating an essential part of an FM receiver according to the invention, an intermediate frequency FM signal from an intermediate frequency amplifier stage (not shown) having an amplitude limiter is applied to an FM detector circuit 11 such as a ratio detector where a stereo composite signal containing multiplexed left and right audio signals and a pilot signal of 19 KHz is recovered from the intermediate frequency FM signal. The recovered stereo composite signal appear between first and second terminals $P_A$ and $P_B$. The pilot signal is extracted from the output signals of the FM detector 11 in a known manner.

The recovered stereo composite signal is applied to a stereo multiplex demodualtor 12, not by way of a coupling capacitor. Thus, the output terminal $P_A$ of the FM detector 11 is also the input terminal of the stereo multiplex demodulator 12. The demodulator 12 is responsive to a 38 KHz subcarrier signal produced by doubling the frequency of the pilot signal to separate the stereo composite signal into time-shared left and right audio signal components L' and R' which appear at output terminals 13a and 13b, respectively.

The demodulator 12 is comprised of a direct-coupled operational amplifier 14 having its inverting input terminal connected to the output terminal $P_A$ of the FM detector 11 through an input resistor Ri and a switch circuit 15 responsive to the 38 KHz subcarrier signal to convert the stereo composite signal into time-shared left and right audio components L' and R' which alternately appear at the output terminals 13a and 13b, respectively. The output terminals 13a and 13b of the switch circuit 15 are connected commonly to the inverting input terminal of the operational amplifier 14 through feedback resistors RfL and RfR to effect negative feedback of fractions of the output signals of the switch circuit 15 to the inverting input of the operational amplifier 14. The noninverting input terminal of the operational amplifier 14 is connected to a circuit point of a given DC potential, e.g. circuit ground as shown. Such negative feedback and connection of the noninverting input terminal of the operational amplifier 14 to ground cooperate to bias the inverting input terminal of the operational amplifier stably to the DC potential of circuit ground. The FM detector 11 is so designed that, when the reference potential point $P_B$ of the detector 11 is grounded, the DC potential at the terminal $P_A$ becomes the ground potential at the absence of the input signal to the detector 11. Since the output terminal of the FM detector 11 and the input terminal of the demodulator 12 can be maintained at the same DC potential, the above-mentioned direct-coupling is permitted.

Figure 2:
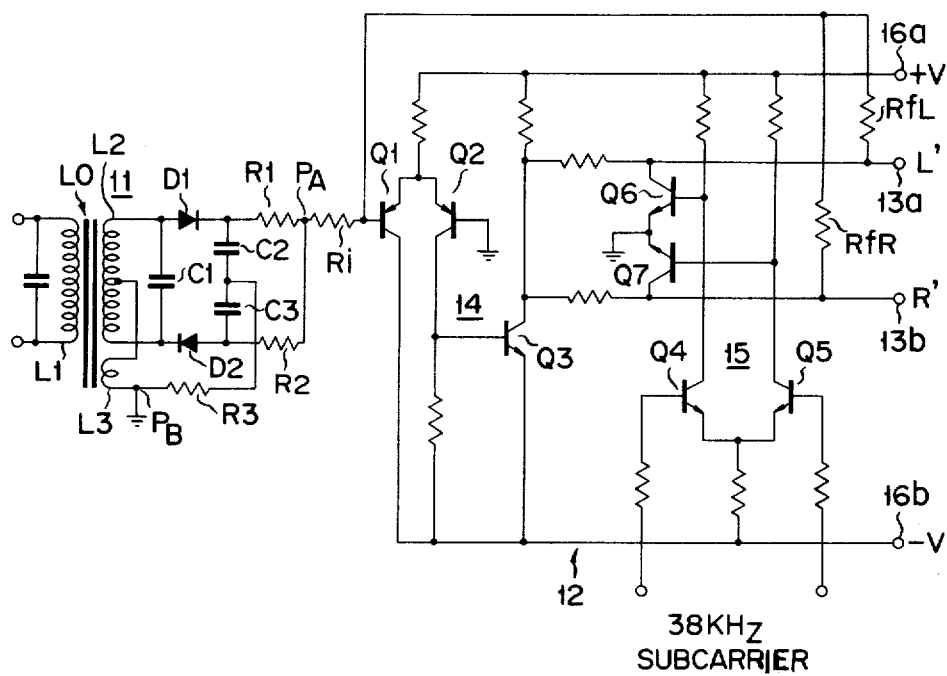
FIG. 2 shows a practical circuit arrangement of an FM receiver employing a two power supply system.

FIG. 2 illustrates a practical circuit arrangement of the embodiment shown in FIG. 1. The FM detector 11 comprises a detector coil assembly Lo having a primary winding L1, a secondary winding L2 and a tertiary winding L3, a capacitor C1 connected in parallel with the primary winding L2 so as to resonate at the intermediate frequency of 10.7 MHz, diodes D1 and D2, capacitors C2 and C3, and resistors R1 to R3. One end of the tertiary winding L3 i.e. the reference potential point $P_B$ of the FM detector 11 is grounded while the other end is connected to the center tap of the secondary winding L2. With such a circuit configuration, the potential at the terminal $P_A$, when an input signal is absent, is equal to the ground potential. The operational amplifier 14 in the stereo multiplex demodulator 12 is comprised of transistors Q1 to Q3 connected between power supply terminals 16a and 16b which are supplied with positive and negative voltages $+V$ and $-V$, respectively. The switch circuit 15 is comprised of transistors Q4 to Q7.

In the operational amplifier 14, the transistors Q1 and Q2 are connected in differential configuration, and the base of the transistor Q2 or the second input terminal of the operational amplifier 14 is connected to ground. The transistor Q3 has its base connected to the collector of transistor Q2 so that an output signal derived from the collector of transistor Q3 is opposite in phase to an input signal applied to the base of transistor Q1 or the first input terminal of operational amplifier. The collector of the transistor Q3, or the output of an inverting amplifier comprised of transistors Q1 to Q3 is coupled to the base of the transistor Q1 through feedback resistors RfL and RfR. Due to the connection of the base of transistor Q2 to ground and the negative feedback paths led from the collector of transistor Q3 to the base of transistor Q1 the DC potential at the base of transistor Q1 is made equal to the ground potential.

In the switch circuit 15, a subcarrier signal of 38 KHz is applied between the bases of transistors Q4 and Q5 which are connected between the power supply terminals 16a and 16b so that the transistors Q6 and Q7 are rendered conductive alternately for each half-cycle of the subcarrier signal. The transistor Q6 is connected such that, when the transistor Q4 is rendered nonconductive, the transistor Q6 is rendered conductive to shunt the output terminal 13a to ground, while, when the transistor Q4 is rendered conductive, the transistor Q6 is rendered nonconductive to electrically couple the output terminal 13a to the collector of transistor Q3 or the output of operational amplifier 14. On the other hand, the transistor Q7 is connected such that, when the transistor Q5 is rendered nonconductive, the transistor Q7 is rendered conductive to shunt the output terminal 13b to ground, while, when the transistor Q5 is rendered conductive, the transistor Q7 is rendered nonconductive to electrically couple the output terminal 13b to the collector of transistor Q3. Owing to such a circuit configuration, the output terminals 13a and 13b are alternately electrically coupled to the output terminal of the operation amplifier 14 for each half-cycle of the subcarrier signal so that time-shared left and right audio components L' and R' appear at the output terminals 13a and 13b, respectively. The circuit is so designed that, in the absence of an input signal, the potentials at the output terminals 13a and 13b become ground potential. As evident from the foregoing, since the output terminal of the FM detector 11 and the input terminal of the stereo multiplex demodulator 12 are held at the same DC potential, the necessity of a coupling capacitor is obviated. Accordingly, an excellent separation characteristic even in a low frequency range can be ensured.

Figure 3:
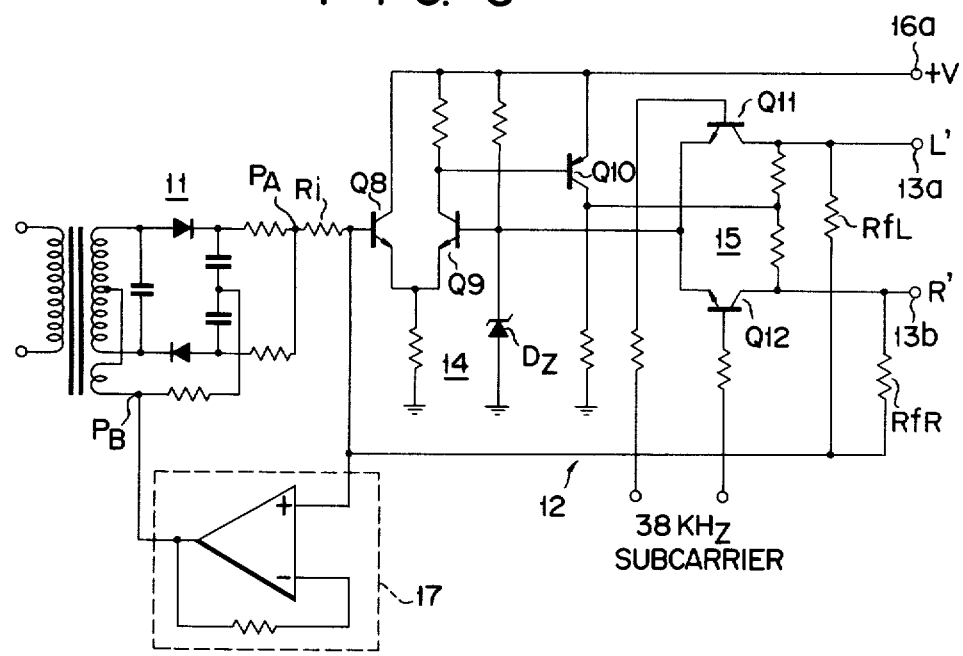
FIGS. 3 and 4 show practical circuit arrangements of FM receivers using a single power supply system.

Turning now to FIG. 3, there is shown a practical circuit arrangement of a second embodiment according to the invention in which a single power supply system is used and thus, the input terminal of the stereo multiplex demodulator should be held at a given DC potential having a predetermined magnitude with respect to the ground potential.

The operational amplifier 14 is comprised of transistors Q8 to Q10 and a zener diode Dz connected between the power supply terminal 16a ($+V$) and ground. The base of transistor Q9, i.e. the second input terminal of the operational amplifier 14 is connected to ground through a back-biased zener diode Dz and thus has a fixed DC potential corresponding to the zener voltage with respect to the ground potential. The collector of transistor Q10 is connected through feedback resistors RfL and RfR to the base of transistors Q8 connected in differential configuration with the transistor Q9. Owing to this circuit connection, the DC potential at the base of transistor Q8 is made equal to that of the transistor Q9. In order to render the DC potential at the reference potential point $P_B$ of FM detector 11 equal to the DC potential at the base of transistor Q8, a voltage follower 17 of a gain of unity is provided which has an input terminal connected to the base of transistor Q8 and an output terminal connected to the reference potential point $P_B$ of the FM detector 11. As a result, the DC potential at the output terminal $P_A$ of the FM detector 11 is made equal to that at the base of transistor Q8, i.e. the first input terminal of the operational amplifier 14.

Figure 4:
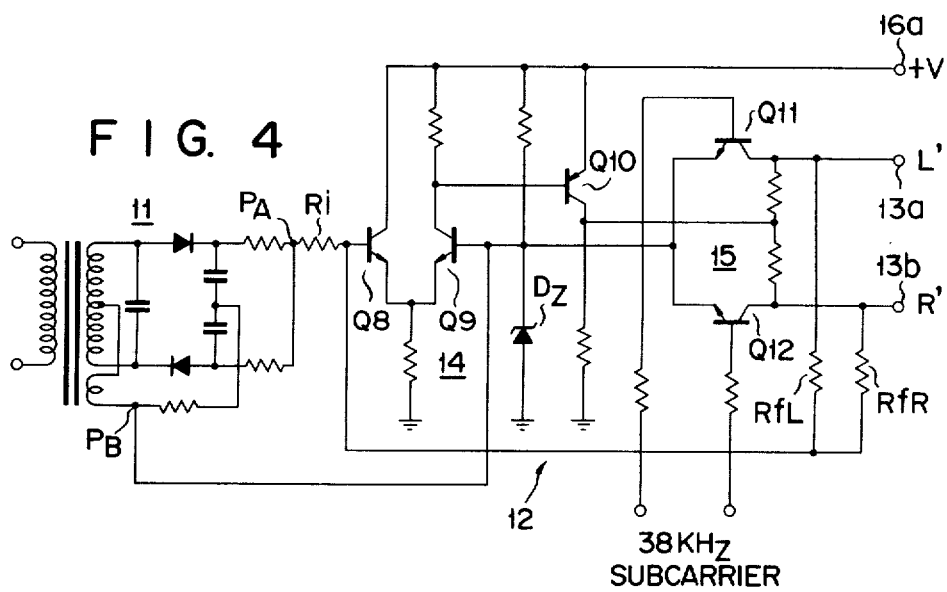

In the switch circuit 15 comprised of transistors Q11 and Q12, a subcarrier signal is applied between the bases of transistors Q11 and Q12 with the result that the transistors Q11 and Q12 are alternately turned on and off. Through the actions of the transistors Q11 and Q12, the output terminals 13a and 13b connected to the collector of transistor Q10 are alternately connected to the base of transistor Q9 biased to the fixed potential so that time-shared left and right audio signal components L' and R' are taken out from the output terminals 13a and 13b, respectively. The reason why the voltage follower 17 with a high input impedance and a low output impedance is provided is that the input impedance at the base of transistor Q8, i.e. the first imput terminal of the operational amplifier is high. Since the input impedance at the base of transistor Q9 connected to the zener diode Dz with a relatively low impedance is low, the base of transistor Q9 may be directly coupled with the reference potential point $P_B$ of the FM detector 11, as shown in FIG. 4.

In the above embodiments, gains Ans and Anm of the demodulator circuit in stereophonic and monophonic program reception modes are given by Ans=RfL (or RfR)/Ri Anm=$(1/Ri) \times \{RfL \cdot RfR/(RfL+RfR)\}$ Since RfL=RfR, Ans is double as large as Anm. In the monophonic reception mode, a continuous audio signal appear at the output terminals 13a and 13b of the demodulator 12. In the stereophonic reception mode, the time-shared left and right audio signal components appear at the output terminals 13a and 13b. Therefore, an average output level in the stereophonic reception mode is equal to that in the monophonic reception mode.

As described above, the FM detector 11 and the stereo multiplex demodulator 12 are directly coupled according to the invention. Accordingly, the demodulator 12 has an S-shaped response centered at 10.7 MHz like the FM detector 11. Therefore, control signals to drive a muting circuit, a tuuing indicator circuit and an automatic frequency control (AFC) circuit in the FM receiver may be formed of the output signal of the demodulator 12, as shown in FIG. 5.

Figure 5:
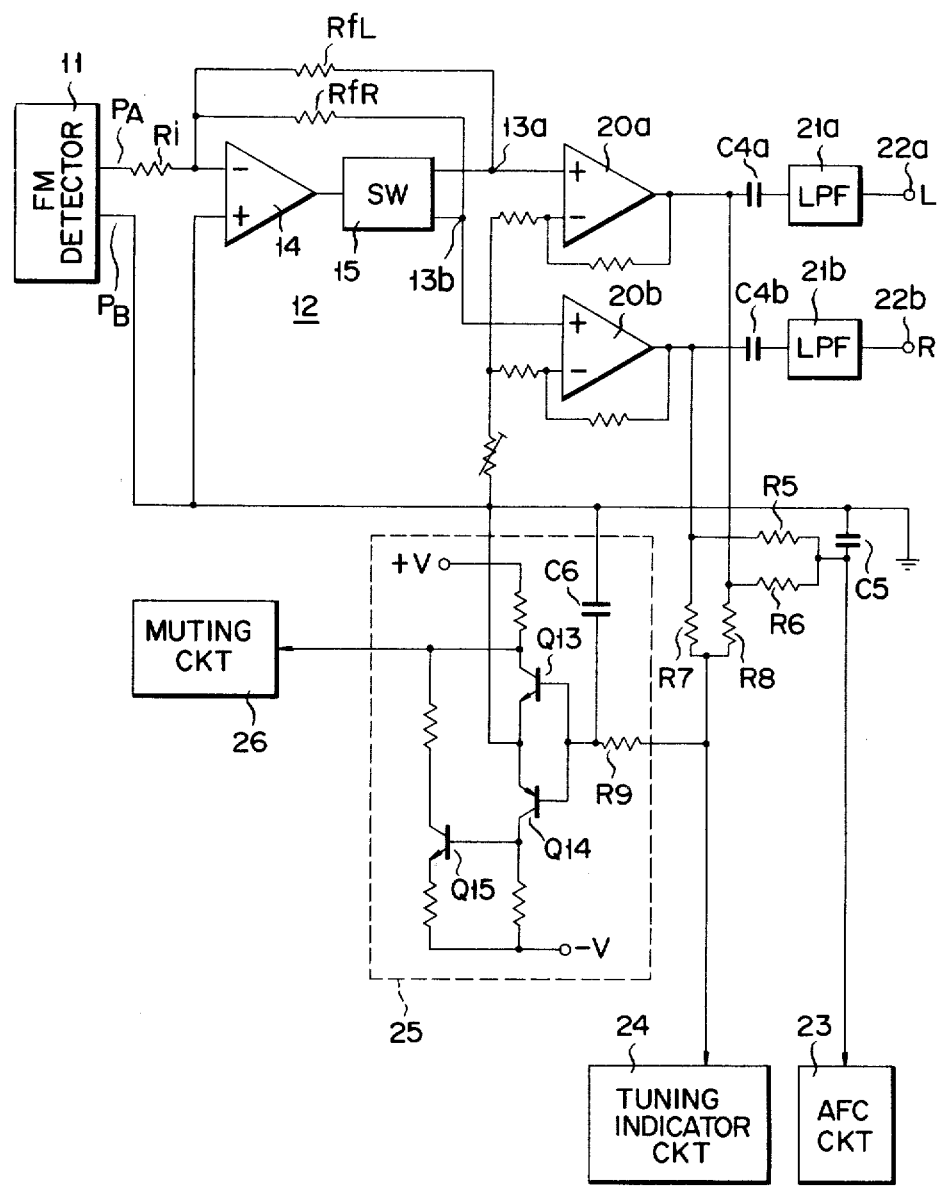
FIG. 5 shows a circuit arrangement for producing control signals to drive an automatic frequency control circut, a tuning indicator circuit and a muting circuit on the basis of output signals from a stereo multiplex demodulator.

In the embodiment shown in FIG. 5, to the output terminals 13a and 13b of the switch circuit 15 are connected direct-coupled operational amplifiers 20a and 20b, acting as noninverting amplifiers in this embodiment, respectively. The output of the operational amplifier 20a is connected to an output terminal 22a through a capacitor C4a and a lowpass filter 21a. On the other hand, the output of the operational amplifier 20b is coupled to the output terminal 22b through a capacitor C4b and a lowpass filter 21b. The capacitors C4a and C4b remove DC components from the output signals of the amplifiers 20a and 20b. The lowpass filters 21a and 21b filter out undesired high frequency components in the output signals. As a result, separate true left and right audio signals L and R appear at the output terminals 22a and 22b, respectively. Resistors R5 and R6 are connected to series between the respective output terminals of the operational amplifiers 20a and 20b with the connection point therebetween connected to ground through a capacitor C5 for removing unwanted high frequency components. Therefore, from the connection point between the resistors R5 and R6 is derived a control signal for driving an automatic frequency control circuit 23. Resistors R7 and R8 are connected in series between the respective outputs of operational amplifiers 20a and 20b to provide a control signal for driving a tuning indicator circuit 24 including a tuning meter. The connection point between the resistors R7 and R8 is also connected to a muting signal detection circuit 25 for supplying a muting signal to a muting circuit 26. The muting signal detection circuit 25 is comprised of a resistor R9 and a capacitor C6 forming a lowpass filter to allow a DC component to pass therethrough, and transistors Q13 to Q15 for producing a muting signal in response to the DC output signal from the lowpass filter. When the output voltage of the lowpass filter comprised of the resistor R9 and the capacitor C6 is 0 volt (this state indicates a good receiving condition of the receiver), both the transistors Q13 to Q15 are turned off. As a result, a signal of a high voltage level (+V) is applied to the muting circuit 26. When the output voltage of the lowpass filter is positive, the transistor Q13 is turned on to issue an output signal of a low voltage level (0 v) to the muting circuit 26 so that the circuit 26 is put into operation. When the output voltage of the lowpass filter is negative, the transistors Q14 and Q15 are turned on, the output signal of the low voltage level is supplied to the muting circuit 26 as in the case where the output voltage of the lowpass filter is positive.

In the circuit construction shown in FIG. 5, the control signals for the automatic frequency control circuit 23, the tuning indicator 24, and the muting circuit 26 is taken out through the stereo multiplex demodulator circuit. Therefore, the control signals have a level enough to drive the circuits. The obviates the need for buffer amplifiers for amplifying a low level control signal taken out of the FM detector circuit, unlike conventional receivers. The signal power system receivers shown in FIGS. 3 and 4 may also produce control signals through the stereo multiplex demodulator.

What is claimed is:

1. An FM radio receiver comprising:
an RM detector circuit connected to receive an incoming FM signal for recovering a stereo composite signal containing multiplexed left and right audio signal components and a pilot signal therefrom, said FM detector circuit having first and second terminals between which the recovered stereo composite signal appears and said second terminal being supplied with a predetermined DC potential so that said first terminal has the predetermined DC potential;
a stereo multiplex demodulator circuit having an input terminal and first and second output terminals for converting the stereo composite signal applied to said input terminal into separate left and right audio signals which appear to said first and second output terminals respectively;
means for causing said input terminal of said demodulator circuit to have the predetermined DC potential; and
coupling means for directly coupling said first terminal of said FM detector circuit to said input terminal of said stereo multiplex demodulator circuit.

2. An FM receiver according to claim 1 wherein said stereo multiplex demodulator circuit comprises an operational amplifier having first and second input terminals and an output terminal for amplifying the stereo composite signal applied to said first input terminal, said second input terminal of said operational amplifier being supplied with the predetermined DC potential; a resistor connected between said first input terminal of said operational amplifier and said input terminal of said stereo multiplex demodulator circuit; a switch circuit connected between said output terminal of said operational amplifier and first and second output terminals of said stereo multiplex demodulator circuit and responsive to a subcarrier signal to convert the stereo composite signal to the separate left and right audio signals; and negative feedback paths directly coupling said first and second output terminals of said stereo multiplex demodulator circuit to said first input terminal of said operational amplifier and having feedback resistors, respectively.

3. An FM receiver according to claim 1 wherein said stereo multiplex demodulator circuit comprises an operational amplifier having first and second input terminals and an output terminal for amplifying the stereo composite signal applied to said first input terminal, said second input terminal of said operational amplifier being supplied with the predetermined DC potential; a resistor connected between said first input terminal of said operational amplifier and said input terminal of said stereo multiplex demodulator circuit; a switch circuit connected between said output terminal of said operational amplifier and said first and second output terminals of said stereo multiplex demodulator circuit and responsive to a subcarrier signal to convert the stereo composite signal to the separate left and right audio signals; and negative feedback paths directly coupling said first and second output terminals of said stereo multiplex demodulator to said first input terminal of said operational amplifier and having feedback resistors, respectively; and wherein said second terminal of said FM detector circuit and said second input terminal of said operational amplifier are connected to circuit ground.

4. An FM receiver according to claim 1 wherein said stereo multiplex demodulator circuit comprises an operational amplifier having first and second input terminals and an output terminal for amplifying the stereo composite signal applied to said first input terminal, said second input terminal of said operational amplifier being supplied with the predetermined DC potential having a predetermined magnitude with respect to ground potential; a resistor connected between said first input terminal of said operational amplifier and said input terminal of said stereo multiplex demodulator circuit; a switch circuit connected between said output terminal of said operational amplifier and said first and second output terminals of said stereo multiplex demodulator circuit and responsive to a subcarrier signal to convert the stereo composite signal to the separate left and right audio signals; and negative feedback paths directly coupling said first and second output terminals of said stereo multiplex demodulator to said first input terminal of said operational amplifier and having feedback resistors, respectively; and wherein said FM receiver further comprises a voltage follower circuit having its input connected to said first input terminal of said operational amplifier, and its output connected to said second terminal of said FM detector circuit.

5. An FM receiver according to claim 1 wherein said stereo multiplex demodulator circuit comprises an operational amplifier having first and second input terminals and an output terminal for amplifying the stereo composite signal applied to said first input terminal, said second input terminal of said operational amplifier being supplied with the predetermined DC potential having a predetermined magnitude with respect to ground potential; a resistor connected between said first input terminal of said operational amplifier and said input terminal of said stereo multiplex demodulator circuit; a switch circuit connected between said output terminal of said operational amplifier and said first and second output terminals of said stereo multiplex demodulator circuit and responsive to a subcarrier signal to convert the stereo composite signal to the separate left and right audio signals; and negative feedback paths directly coupling said first and second output terminals of said stereo multiplex demodulator to said first input terminal of said operational amplifier and having feedback resistors, respectively; and wherein said second terminal of said FM detector circuit is direct-coupled to said second input terminal of said operational amplifier.

6. An FM receiver according to any one of claim 2 or 5 wherein said first and second input terminals of said operational amplifier are an inverting input terminal and a noninverting input terminal, respectively.

7. An FM receiver according to claim 4 or 5 wherein a zener diode is connected between said second input terminal and circuit ground.

8. An FM receiver according to any one of claim 1 or 5 wherein circuit means for producing a control signal for an automatic frequency control circuit is coupled to said first and second output terminals of said stereo multiplex demodulator circuit.

9. An FM receiver according to any one of claim 1 or 5 wherein circuit means for producing a control signal for a tuning indicator circuit is coupled to said first and second output terminals of said stereo multiplex demodulator circuit.

10. An FM receiver according to any one of claims 1 or 5 wherein circuit means for producing a control signal for a muting circuit is coupled to said first and second output terminals of said stereo multiplex demodulator circuit.

* * * * *